(12) United States Patent
Bakker et al.

(10) Patent No.: US 11,726,008 B2
(45) Date of Patent: *Aug. 15, 2023

(54) VIRTUALIZED AUTOMATED TEST EQUIPMENT AND METHODS FOR DESIGNING SUCH SYSTEMS

(71) Applicant: TECH180 CORPORATION, East Hampton, MA (US)

(72) Inventors: Christopher Bakker, East Hampton, MA (US); Roy Dennis Walker, Chesterfield, MA (US); Burt Snover, Florence, MA (US)

(73) Assignee: TECH180 CORPORATION, East Hampton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/546,366

(22) Filed: Dec. 9, 2021

(65) Prior Publication Data
US 2022/0099535 A1 Mar. 31, 2022

Related U.S. Application Data

(63) Continuation of application No. 16/918,461, filed on Jul. 1, 2020, now Pat. No. 11,226,267.
(Continued)

(51) Int. Cl.
*G06F 11/30* (2006.01)
*G01M 99/00* (2011.01)

(52) U.S. Cl.
CPC .................. *G01M 99/005* (2013.01)

(58) Field of Classification Search
CPC .................................................. G01M 99/005
See application file for complete search history.

(56) References Cited

U.S. PATENT DOCUMENTS 5,025,205 A 6/1991 Mydill et al.
11,226,267 B2 * 1/2022 Bakker ............... G06F 11/2733
(Continued)

FOREIGN PATENT DOCUMENTS

KR 101898341 B1 10/2018

OTHER PUBLICATIONS

International Search Report and Written Opinion, dated Nov. 25, 2020, from related International Patent App. No. PCT/US2020/047340.
(Continued)

*Primary Examiner* — Phuong Huynh
(74) *Attorney, Agent, or Firm* — Andrew Ryan Sommer; Greenberg Traurig, LLP

(57) ABSTRACT

A virtualizable automated test equipment architecture includes a circuit assembly. The circuit assembly includes a number of signal paths that extend between a front plane and a backplane. The signal paths can be continuous and isolated from other signal paths of the plurality of signal paths. The circuit assembly also includes an impedance disposed along a signal path of the plurality of signal paths. A plurality of software-configurable physical disconnects may be arranged within the circuit assembly to form a switching matrix. The plurality of signal paths can be associated with a plurality of software-configurable physical disconnects, which can be configured to open and close signal paths of the plurality of signal paths based on the predetermined test requirements. The circuit assembly also includes a plurality of external device connections, at least one of which may be configured to interface with a unit under test (UUT). The software configurable physical disconnects may be configurable at runtime. Because the system if virtualizable, multiplied UUTs may be tested simultaneously according to different requirements, and the testing may be executed on shared hardware in a manner transparent to the UUTs.

18 Claims, 8 Drawing Sheets

Related U.S. Application Data

(60) Provisional application No. 62/892,481, filed on Aug. 27, 2019.

(56) References Cited

U.S. PATENT DOCUMENTS

| | | |
|---|---|---|
| 2005/0154550 A1 | 7/2005 | Harsanjeet et al. |
| 2005/0240373 A1 | 10/2005 | Wubbena et al. |
| 2007/0245199 A1 | 10/2007 | Pochowski |
| 2013/0257448 A1* | 10/2013 | Tu .......................... G06F 11/24 |
| | | 324/538 |
| 2015/0339216 A1* | 11/2015 | Wade .................. G06F 11/3684 |
| | | 714/38.1 |
| 2016/0238657 A1 | 8/2016 | Czamara et al. |
| 2017/0146632 A1* | 5/2017 | Wadell ............... G01R 31/3191 |
| 2017/0276725 A1 | 9/2017 | Birurakis et al. |

OTHER PUBLICATIONS

Kirsop, D., "Signal Switching in Automated Test Equipment," Machine Design, Penton Media, Cleveland, OH, US, vol. 60., No. 29, pp. 75-80 (1988).

Supplementary European search report dated Sep. 27, 2022 (10 pages).

\* cited by examiner

VIRTUALIZED AUTOMATED TEST EQUIPMENT AND METHODS FOR DESIGNING SUCH SYSTEMS

This application is a continuation of U.S. patent application Ser. No. 16/918,461 filed Jul. 1, 2020, which is a non-provisional of U.S. Provisional Application No. 62/892,481 filed Aug. 27, 2019, the entireties of which are hereby incorporated by reference.

FIELD

The present disclosure relates to automated test equipment.

BACKGROUND

In commercial computing hardware and software like servers and desktops, multiple systems can be combined together or sub-partitioned to form any number of subsystems. This is called virtualization. Each of these subsystems can act autonomously and run simple generic software that is sufficient to perform the limited tasks assigned one subsystem. Alternatively, a single massive computer could be constructed along with software needed to arbitrate assign resources to each task that is required to be performed. While the former is computationally less efficient at the unit level, the performance of any installation of scale—like a server farm for example—is drastically improved by virtualization technology. This is because virtualization allows significantly lower cost and effort to design, build and maintain these installations. The performance of the computing resources themselves is lower, but the performance of the mission and organization that carries it out is drastically improved.

Complex electro-mechanical systems are unlike commercial computing platforms in that their physical interfaces of these systems are not industry standards, but are arbitrary and highly application specific. These boundaries must integrate multiple technologies—from a few to hundreds—to implement end to end functional requirements. These technologies take the form of discrete subcomponents of mechanical and electrical/electronic hardware and software, which must be combined and connected at their interfaces to form a larger system that meets its end to end functional requirements at the outermost boundary interface. Because of the variety and a large number of possible permutations, virtualization of these systems is impractically difficult to achieve. Thus the only implementations that exist to date in industry are either large universal systems that implement multiple system requirements in their entirety, or explicitly distributed systems with static subsystem roles and strictly defined interactions between subsystems.

Similar problems exist in other complex systems such as automated testing equipment. As a general matter, testing is performed because validation of a design or manufacturing process is generally more costly after deployment of a system/product than it is before deployment. Complex cyber-physical systems involving mechanical components, electronic hardware, and software interacting with the real world in real-time particularly benefit from testing. For such systems, extensive iterative testing becomes integral to the ability to do business. The consequences of field failures are not just warranty problems. Possible repercussions include the loss of life, the destruction of multi-million-dollar capital assets, or the closure of a strategic time window to go to market. When it comes to system testing, often the most effective optimization goal is to enable the organization to maximize the amount of test coverage it can produce for the particular system being designed.

Requirements for automated test systems specify three main things: (1) verifiable electrical profile/characteristics at the boundary of the product, (2) qualified software interface to compare the measured or simulated value of the interface to the requirement, (3) dynamic performance sufficient to capture or produce the behavior/scenario at the interface.

One industry in which testing before deployment is critical is the aerospace industry. Currently, state of the art and standard practice for test systems used in the aerospace industry tend to be large system platforms with a common interface using standard instruments.

Such test systems include a software environment that allows for standard test programs. The typical interface to these systems will usually be many hundreds if not thousands of test points that can be adapted to test many different Units Under Test (UUT). To adapt the large test system to a given UUT there are hardware and software components of this test capability. The UUT is cabled to a Test Unit Adapter (TUA) that contains switches, loads, and custom signal conditioning to adapt the standard test instruments to the UUT specific requirements. Similarly, a common software library is leveraged to create a UUT specific test script. These two components are referred to as a Test Program Set or TPS. There are advantages and disadvantages to using this approach when compared to a wholly-customized design.

Typical automated test equipment (ATE) include instrumentation, I/O modules, switching and multiplexing cards attached to a large mass interconnect. A TUA is designed and developed per each UUT to adapt the generic I/O to the UUT test needs. Switch routing, signal conditioning and loads generally are custom designed and hand-wired. The Architecture of a typical large universal ATE system looks similar to that shown in FIG. 1.

Such systems are often developed as a "common core" test system. A common core test system may have 80% to 90% of the most common requirements and can provide augmentation with application-specific software plugins or custom hardware. These target duplicate non-recurring engineering costs by preventing the same work from being performed repeatedly. In other words, design of ATE using a common core approach results in a common architecture and permits reuse of components—both hardware and software. This reuse is where the main cost savings of this approach comes from. A common test platform environment that meets all test requirements allows for system reuse many times without redesign. The cost of design and verification of a new test system is a major driver of cost. To reproduce or rebuild additional test systems can usually be done at a much lower price point sans design effort. They allow new devices to be tested by configuring the common component and only incurring meaningful non-recurring engineering costs where it is required by the specific device to be tested.

Nevertheless, automated test equipment developed according to the common core approach suffer from several problems that have not heretofore been acknowledged or solved by those in the field. The creation of a universal test system to cover all or many UUT's creates a large and expensive system. To replicate the design, many expensive instruments must be put into the system. In circumstances in which smaller UUTs are to be tested, these instruments may not be necessary. For a smaller coverage of test assets, this results in a needlessly complex product that includes many more instruments than are needed, thus increasing complexity of the design and cost at the expense of saving cost during system design. Additionally, such a design can lead to the inefficient use of instruments included within the ATE system design.

Additionally, using the common core approach, while the common test platform may be reproduced without incurring additional design engineering costs, the addition of TPS for any UUT test requirements typically requires a custom design TUA. Custom designed adapters may be large and complex. It is not possible to remove this design cost using the common core approach.

Because of the need for commonality of design in a common core ATE system, their use may be limited. Specifically, these large core ATE systems may permit only one type of UUT to be tested at any one time. This can cause bottlenecks when the ATE systems are used and the issue may be particular acute during system maintenance or calibration. Similarly, areas which require testing for a smaller number of test articles may have difficulty scaling the system down to meet a limited test coverage situation.

SUMMARY

The principles of the present disclosure may be implemented in accordance with certain specific examples. Why certain exemplary embodiments are described herein, the person of ordinary skill in the art will recognize that the principles disclosed herein can by employed in many different automated test equipment designs.

One exemplary implementation of the principles disclosed herein includes a virtualizable automated test equipment architecture with a circuit assembly. The circuit assembly includes a front plane and a backplane. The circuit assembly also includes a number of signal paths that extend between the front plane and the backplane. The signal paths extending between the front plane and the backplane are continuous and isolated from other signals paths of the plurality of signal paths. The circuit assembly also includes an impedance network disposed along a signal path of the plurality of signal paths. The impedance network can be configured based on predetermined test requirements. The circuit assembly according to this example also includes a software configurable physical disconnect configured to open or close at least one of the plurality of signal paths based on predetermined test requirements. A plurality of software-configurable physical disconnects may be arranged to form a switching matrix. The plurality of signal paths can be associated with a plurality of software-configurable physical disconnects, which can be configured to open and close signal paths of the plurality of signal paths based on the predetermined test requirements. The circuit assembly also includes a plurality of external device connections, at least one of which may be configured to interface with a unit under test (UUT). The software configurable physical disconnects may be configurable at runtime.

According to certain implementations, the external connections of the virtualizable automated test equipment architecture can include at least two external device connections in which at least one of the external device connections is configured to interface with a UUT.

According to another implementation, the virtualizable automated test equipment architecture can also include a controller coupled to the software-configurable disconnect, where the controller is configured to set the software configurable physical disconnect to one of an open or closed state based on the predetermined test requirements. The controller can be configured to control the state of the plurality of software-configurable physical disconnects such that each of the plurality of software-configurable physical disconnects is in an open state or a closed state thereby creating one or more virtualized test systems from hardware included in the virtualizable automated test equipment architecture.

In yet other aspects of an exemplary implementation of the virtualizable automated test equipment disclosed herein, the virtualizable automated test equipment architecture can further include a signal conditioner. The signal conditioner may be disposed along at least one of the plurality of signal paths. The signal conditioner may be configured based on the predetermined test requirements.

In certain implementations, the virtualizable automated test equipment architecture's circuit assembly can also include a computer-readable storage medium having processor-readable code stored in or on the medium. That processor-readable code can include code configured to receive data based on the predetermined test requirements as an input. And the processor-readable code may be configured to output data indicating the state of the software-configurable physical disconnects based on the test requirements. The data output from the processor-readable code may be used to generate control signals to set the state of respective ones of a plurality of software-configurable physical disconnects to one of an open state or a closed state. The control signals may be acted upon by a controller to set the states of the plurality of software-configurable physical disconnects such that they are arranged to create one or more virtualized test systems from hardware included in the virtualizable automated test equipment architecture.

The processor-readable code can also include code configured to execute a system self-check routine to confirm operation in compliance with the predetermined test requirements. The control signals may be acted upon by a controller to set the state of the software-configurable physical disconnects to one of an open state or a closed state. The software-configurable physical disconnect may be configurable at runtime.

According to another exemplary implementation of the automated test equipment, the software configurable physical disconnect can be one of a plurality of software configurable physical disconnects included in the circuit assembly. These plurality of software configurable physical disconnects can be configured as a software-configurable switching matrix. The software-configurable switching matrix can have a first state based on a first set of test requirements associated with a first unit under test and a second state based on a second set of test requirements associated with a second unit under test. The first unit under test and the second unit under test can have different test requirements.

Exemplary methods according to the principles disclosed herein include a method of configuring a virtualizable automated test equipment architecture. The method can include automatically identifying a plurality of impedance characteristics based on test requirements. The impedances are then installed on the virtualizable automated test equipment architecture. A switching matrix including a plurality of software-configurable physical disconnects may then be automatically configured. The configuration of the switching matrix can include setting the state of a first subset of the plurality of software-configurable physical disconnects to create a first virtualized automated test equipment architecture based on a first subset of the plurality of test requirements. The setting of the state of the first subset of the plurality of software-configurable physical disconnects can include setting some of the software-configurable physical disconnects to an "on" state and others to an "off" state. The setting the state of the first subset of the plurality of software-configurable physical disconnects thus opens or closes a first plurality of signal paths. As in other examples, the signal paths of the first plurality of signal paths are continuous and isolated from other signal paths between an input and an output of the virtualizable automated test equipment architecture. The method also includes setting a state of a second subset of the plurality of software-configurable physical disconnects to create a second virtualized automated test equipment architecture based on a second subset of the plurality of test requirements. Again, the setting of the state of the second subset of the plurality of software-configurable physical disconnects can include setting some of the software-configurable physical disconnects to an "on" state and others to an "off" state. The setting the state of the second subset of the plurality of software-configurable physical disconnects opens or closes a second plurality of signal paths, the signal paths of the second plurality of signal paths are continuous and isolated from other signal paths between an input and an output of the virtualizable automated test equipment architecture.

According to some examples, the second subset of the plurality of software-configurable physical disconnects includes at least one software-configurable physical disconnect that is also included within the second subset of the plurality of software-configurable physical disconnects. In other examples, the subsets of software-physical disconnects may not include any of the same software-configurable physical disconnects, such that the subsets are mutually exclusive from one another.

According to certain examples, a method including configuring the switching matrix can also include receiving control signals generated based on the received plurality of test requirements. Based on the control signals, the state of the first and second subset of the plurality of software-configurable physical disconnects may be set.

Additional aspects of a method can include performing a system-self check routine by comparing the state of the first subset of software-configurable physical disconnects to an expected state of the first subset of software-configurable physical disconnects. The expected state of said first subset of software-configurable physical disconnects being determined based on the first subset of the plurality of test requirements. This process may also be completed for a second subset of software-configurable disconnects based on the second subset of the plurality of test requirements. The first subset of the plurality of test requirements can be distinct from the second subset of the plurality of test requirements.

According to still other methods, the first subset of the plurality of test requirements can be associated with a first unit under test. The second subset of the plurality of test requirements is associated with a second unit under test, the first and second units under test having different operational requirements.

DRAWINGS

DETAILED DESCRIPTION

Figure 1A:
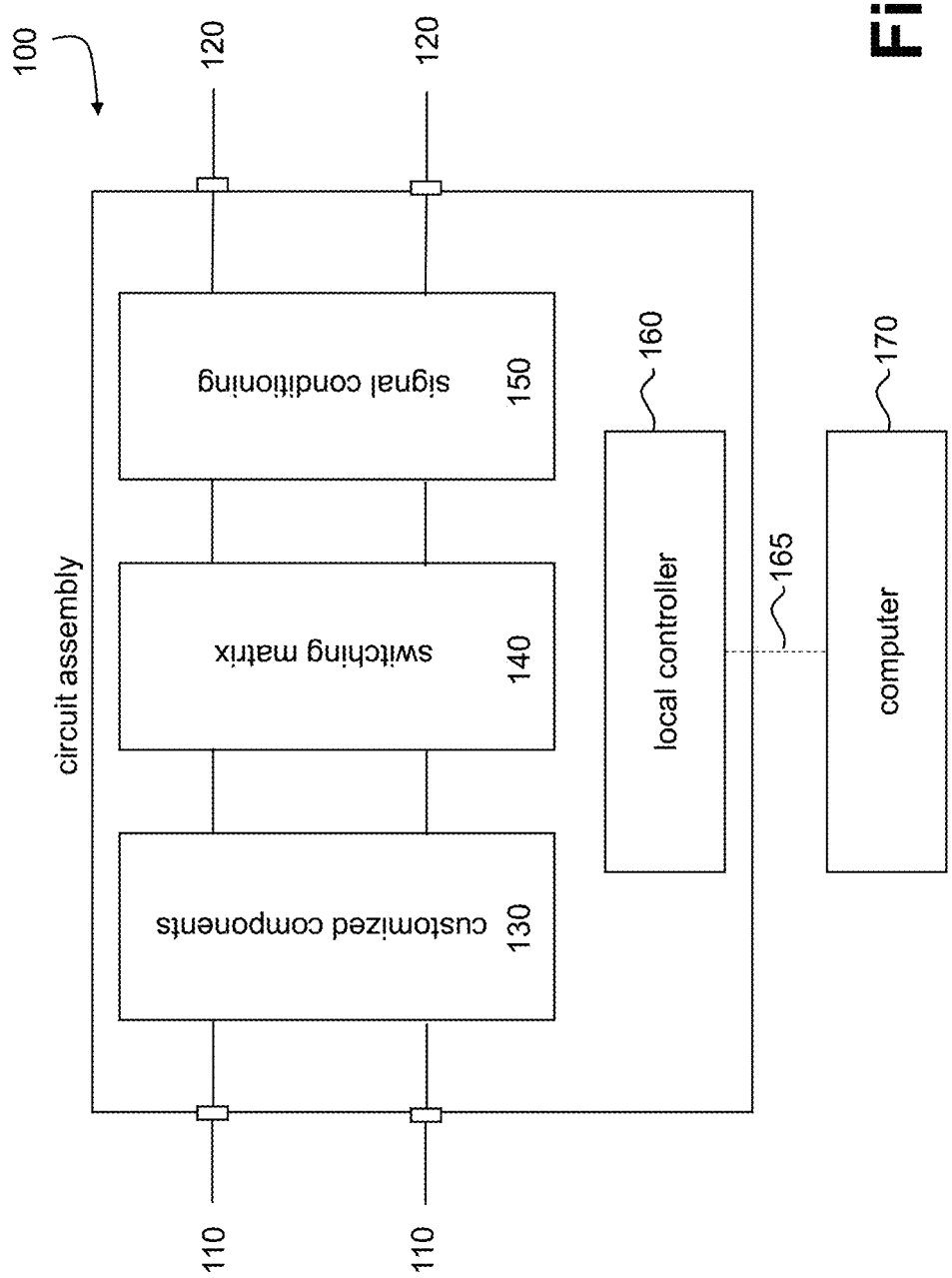
FIG. 1A illustrates a high-level schematic of a circuit assembly usable within a virtualizable automated test equipment architecture according to one example implementing the principles of the present disclosure.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

According to one aspect of the disclosed embodiments, a novel and non-obvious test architecture is provided that is able to leverage the commonality of hardware and software, but which also may be configured to allow for increased flexibility and scalability of ATE over prior approaches. According to certain embodiments, such an architecture may also eliminate the need for a test unit adapter (TUA), which may, according to certain embodiments, be replaced by a simplified cable set.

As explained above, automated test equipment specifications generally need three things: (1) verifiable electrical profile/characteristics at the boundary of the product, (2) qualified software interface to compare the measured or simulated value of the interface to the requirement, (3) dynamic performance sufficient to capture or produce the behavior/scenario at the interface. The principles of the present disclosure can provide these criteria through the provision of a virtualizable automated test equipment architecture.

FIG. 1A illustrates a high-level schematic of a circuit assembly usable within a virtualizable automated test equipment architecture according to one example implementing the principles of the present disclosure. As shown in FIG. 1A, a circuit assembly 100 includes multiple inputs 110 and multiple outputs 120. The inputs and outputs can provide for connections to external devices (not shown). The external devices can be units under test (UUTs), loads defined by hardware, or software-based simulation devices that simulate the behavior of electrical components in accordance with the needs of a predetermined test requirements as will be described in further detail herein.

As shown in FIG. 1A, the circuit assembly can include at least three types of general components including customized components 130, a switching matrix 140, and signal conditioning circuits 150. The customized components 130 can be customizable impedance networks, for example, which are designed to manipulate the signals on signal lines extending between a front plane and a back plane of the circuit assembly 100. The switching matrix 140 may include a plurality of software-configurable physical disconnects, each of which may assume an on state or an off state depending on signals provided by either a local controller 160 or computer 170. As illustrated in FIG. 1A, the local controller 160 may be disposed in such a manner so as to be part of the overall circuit assembly. In the alternative local controller 160 may be disposed on a board that is coupled to the circuit assembly either directly or indirectly through other components (not illustrated). Regardless of the precise configuration of local controller 160 with respect to circuit assembly 100, the local controller is configured to control various functionality of the automated test equipment architecture including during the use of the automated test equipment architecture.

Computer 170 may be configured to be coupled to the local controller over an interface connection 175. Interface connection 175 may be implemented as any of a wide variety of interfaces such as a Small Computer System Interface (SCSI), a Universal Serial Bus (USB), ethernet, serial bus, parallel bus, or other type of interface. In other embodiments, the interface can be a wireless interface such as a Bluetooth interface of a WiFi connection. As shown in FIG. 1A, the computer 170 may be temporarily coupled to the circuit assembly 100 to allow the upload of firmware, to configure the virtualizable automated test equipment architecture, to upload information related to changes to the configuration of the virtualizable automated test equipment architecture, or to obtain information about the status of the virtualizable automated test equipment architecture.

Computer 170 may be configured to output data to local controller 160 and to receive data from local controller. Data that may be provided from computer 170 to local controller 160 includes customized test executive software, configuration information, including information regarding the state of the switching matrix for the performance of certain predetermined tests according to predetermined test requirements. Other examples of data that may be provided by computer 170 to local controller 160 are described in further detail herein. Computer 170 may be configured to receive data from the local controller including information regarding the current state of the virtualizable automated test equipment architecture, firmware version running on the virtualizable automated test equipment architecture, date of last configuration of the virtualizable automated test equipment architecture, the identity of the person that last configured the virtualizable automated test equipment architecture, an indication of any errors determined by comparing an actual state of the virtualizable automated test equipment architecture with an expected state of the virtualizable automated test equipment architecture, among other things.

As will be explained in further detail below, by setting the switching matrix to assume a specified state based on a software-specified set of software-configurable physical disconnects, the hardware including the customized components and the signal conditioning components may be virtualized so as to allow different test programs to execute on the virtualizable automated test equipment architecture without requiring system re-design or manual reconfiguration of the automated test equipment architecture.

Figure 1B:
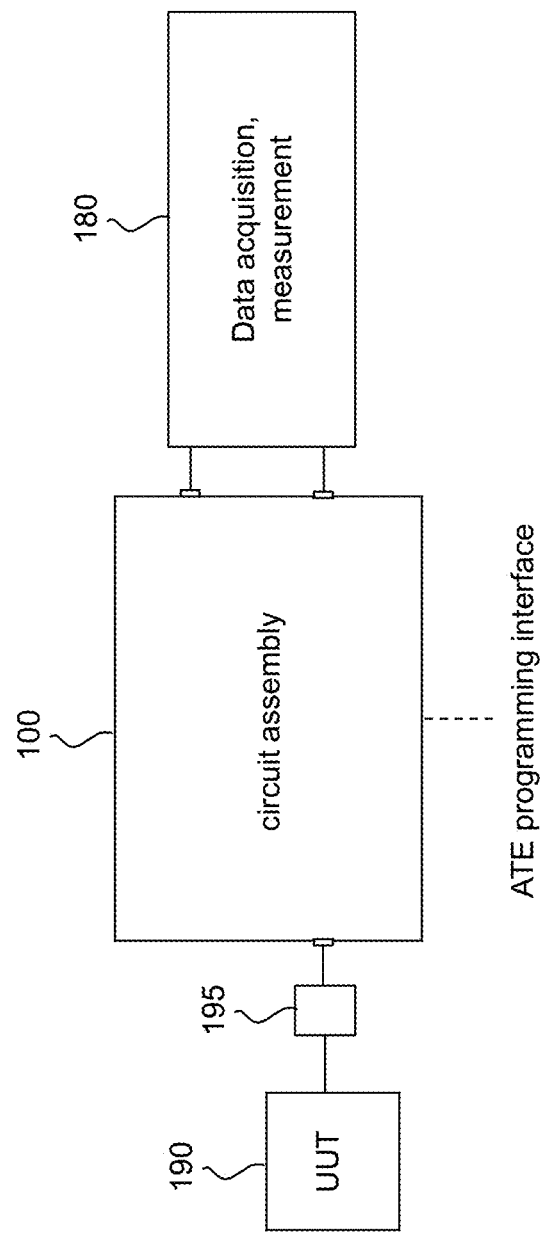
FIG. 1B illustrates a high-level schematic of portions of a virtualizable automated test equipment architecture implementing the principles of the present disclosure in which one external device connection interfaces with a UUT and other external device connections interfaces with data acquisition and measurement equipment.

FIG. 1B illustrates a high-level schematic of portions of a virtualizable automated test equipment architecture implementing the principles of the present disclosure in which one external device connection interfaces with a UUT 190 and other external device connections interfaces with data acquisition and measurement equipment 180. The circuit assembly is designed according to the principles set forth herein. The data acquisition and measurement equipment 180 can include equipment such as a digital multimeter, an oscilloscope, data acquisition and logging systems, data loggers, and the like.

Figure 2:
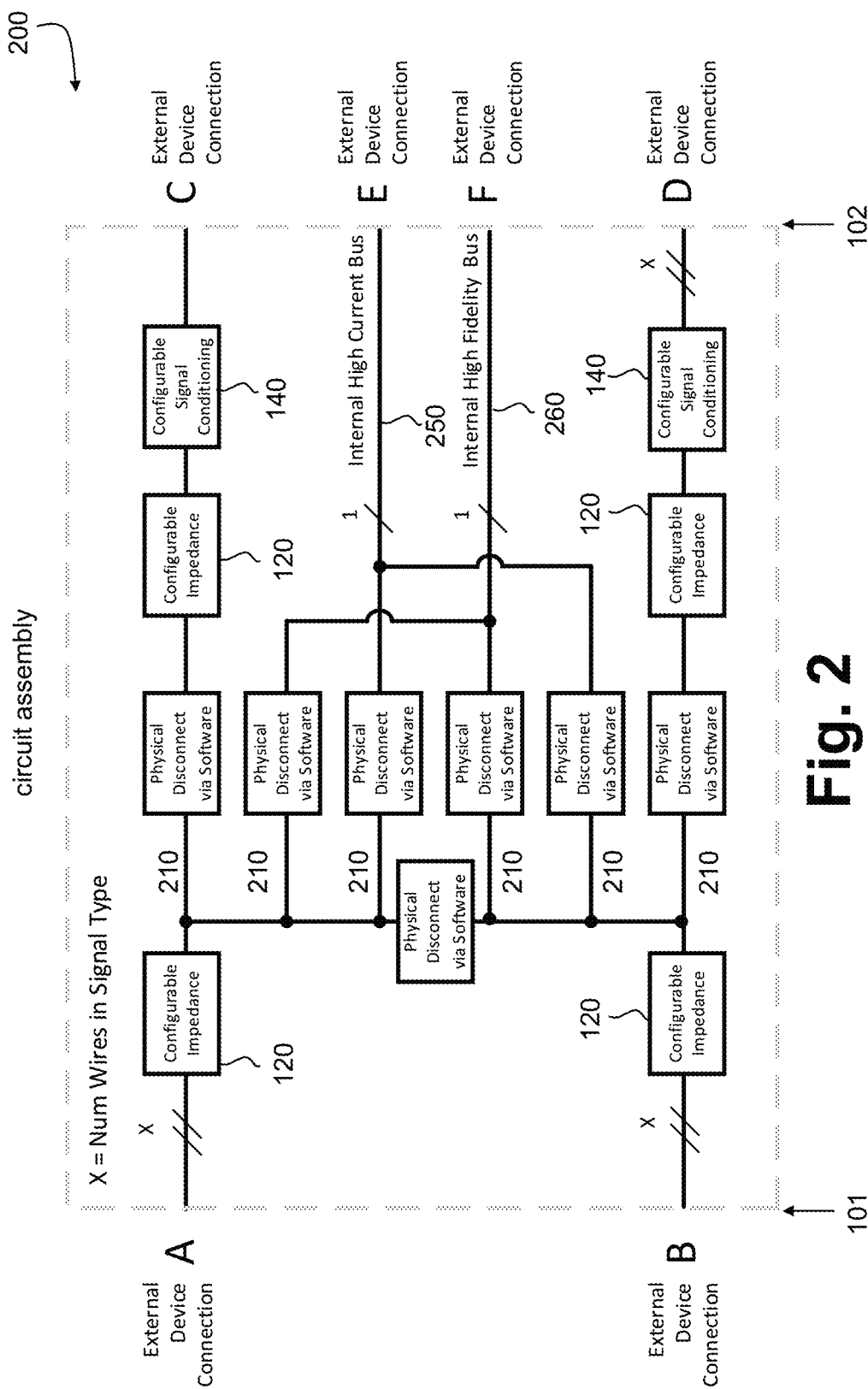
FIG. 2 illustrates an exemplary illustration of a circuit assembly usable within a virtualizable automated test equipment architecture according to one example implementing the principles of the present disclosure.

FIG. 2 illustrates a circuit assembly 200 usable within a virtualizable automated test equipment architecture according to one example implementing the principles of the present disclosure. Those skilled in the art will understand that the circuit assembly 200 illustrated in FIG. 2 is for illustration purposes only and that a circuit assembly implementing the techniques described herein may have many external device connections, signal paths, configurable impedances, software physical disconnects, and configurable signal conditioning circuits. Circuit assembly 200 may include a front plane 201 and a backplane 202. A plurality of signal paths 210 extend through the circuit assembly 200 between the front plane 201 and the backplane 202. Each of the plurality of signal paths 210 may be arranged such that it is continuous between the front plane 201 and backplane 202. Each of the plurality of signal paths 210 can also be isolated from other signal paths of the plurality of signal paths. In referring to "each" of the plurality of signal paths being continuous between the front plane and the backplane and isolated from other signal paths of the plurality of signal paths, this does not mean that every signal path through the circuit assembly 200 needs to meet these criteria. Instead, these criteria are applied to each of the plurality of signal paths 210, but other signal paths need not be both isolated from other signal paths 210 and continuous from the front plane 201 to the backplane 202.

According to one example, as illustrated in FIG. 2, at least one of the plurality of signal paths may be tied to an internal high current bus 250. Another of the signal paths may be tied to an internal high-fidelity bus 260.

The circuit assembly 200 includes at least one impedance network 220 disposed along a signal path of the plurality of signal paths 210. As shown in FIG. 2, the exemplary circuit assembly 200 includes four configurable impedances 220. Configurable impedances 220 can be configured based on predetermined test requirements. The predetermined test requirements can define the electrical properties that are to be performed by an automated test equipment architecture. Values for an expected behavior of the automated test equipment may be input into a software application from the predetermined test requirements. Based on these values from the predetermined test requirements a value or value and a characteristic of an impedance of impedance network 220 may be output by the software and the impedance network(s) 220 may be configured based on the value(s) output by the software.

Additionally, circuit assembly 200 may include a configurable signal conditioning circuit 240. In the embodiment illustrated in FIG. 2, there are two configurable signal conditioning circuits 240 illustrated. The configurable signal conditioning circuits 240 may be configured based on the predetermined test requirements. The predetermined test requirements can define the electrical properties of the signal such that the signal output from the signal conditioning circuit exhibits certain properties such as having a specific amplitude or a certain bandwidth. For instance, signal conditioning can include, but is not limited to signal filtering. In another example, signal conditioning can include amplification or attenuation. Values from the predetermined test requirements may be input into the software that is used to determine an impedance value of the impedance network to determine how to configure the configurable signal conditioning circuit 240. Based on the values input from the predetermined test requirements the software may output information identifying a specific amplifier, for example, to be placed along a signal path of the plurality of signal paths 210. The software may further output information regarding a specific filter to be placed along a signal path of the plurality of signal paths 210. These are merely exemplary signal conditioning circuits that can be used as configurable signal conditioning circuit 240 in accordance with the principles disclosed herein.

Circuit assembly 200 further includes at least one software-configurable physical disconnect 230. The software-configurable physical disconnect is configured to receive a signal and take one of an open state or a closed state. In preferred embodiments based on the principles disclosed herein, circuit assembly 200 includes plurality of software-configurable physical disconnects 230. The state of the software-configurable physical disconnects 230 may be set based on a signal generated in hardware under the control of software. The state of one or more of the software physical disconnects 230 may be set at runtime. The software may receive values associated with the predetermined test requirements. Based on the values associated with the predetermined test requirements, the software is configured to calculate the state of the plurality of software configurable physical disconnects 230.

As used herein the phrase software-configurable physical disconnect is not intended to be limited to a physical disconnect that can only be configured based on the execution of software code. Instead, the phrase software-configurable physical disconnect is able to be configured based on the execution of any type of processor-readable code including, for example, software or firmware.

A controller, such as local controller described with respect to FIG. 1, may be coupled to the software-configurable physical disconnects 230. The controller (not shown in FIG. 2) may thus be configured to set the software-configurable physical disconnect to one of an open state or a closed state based on the predetermined test requirements. In this way, the software-configurable physical disconnects may be configured to open and close signal paths of the plurality of signal paths based on the predetermined test requirements. The controller may be configured to control the state of the plurality of software configurable physical disconnects such that each of the plurality of software configurable physical disconnects has an open state or a closed state so as to create one or more virtualized test systems from hardware included in the virtualizable automated test equipment architecture. In other words, slices may be defined within the virtualizable automated test equipment architecture to perform certain test functionality and provide a certain set of signals that are independent from a separate slice defined by the same, overlapping, or independent automated test equipment hardware within the same virtualizable automated test equipment architecture.

The controller may be associated with a computer-readable storage medium having processor-readable code stored thereon. The computer-readable storage medium may be one or more of a variety of various computer-readable storage media including, but not limited to flash memory, optical memory, magnetic disc.

By creating a virtualizable automated test equipment architecture including circuit assembly 200 based on the principles described herein, the circuit assembly 200 may be configured to deliver all signals to and from the product boundary and produce a report of results in software thereby satisfying the test system requirements for a particular product or UUT. The specifics of the precise implementation of circuit assembly 200 does can be irrelevant from the perspective of the unit under test (UUT). As described above, the circuit assembly 200 may be implemented in any number of permutations of hardware and software. The specific permutations of hardware and software as implemented in any one embodiment can be dictated by the predetermined test requirements. By implementing the principles described herein, an automated test equipment architecture may be designed in slices, where each slice represents the coverage met for one single product interface (signal). If each slice is independent from the next, the virtualizable automated test equipment architecture can be assembled and disassembled easily, and stacked in any combination to match the interface requirements of any product.

A complete signal path from product to software can be accounted for through several transition points and conversion layers. To define that signal path, each signal may have: (1) an endpoint at the product interface; (2) a connection from product interface to the test system boundary; (3) connection from test system boundary to signal source boundary; (4) software interface to signal source/measurement; and (5) software from signal source/measurement to results format. A high-level illustration of such a system is shown in FIG. 1, and an exemplary circuit assembly 200 implementing the principles of this disclosure is illustrated in FIG. 2.

According to a specific implementation of the examples described above, the virtualizable automated test equipment architecture may include an external cable with an appropriate number of wires needed to connect the signal from the product to the test system. The external cable may have a matching disconnect at each boundary. The externa connection are reflected in FIG. 2 as external device connections A, B, C, D, E, and F. The virtualizable automated test equipment architecture may also include an internal cable with an appropriate number of wires needed to connect the signal from the test system boundary to the signal source. An example of this is illustrated in FIG. 2, in which external device connections are shown in FIG. 2 as being associated with the various external device connections, and the number of wires in the signal type is indicated by the variable "x," indicating that there is some number of wires in the signal type. The internal cable may also have matching disconnects at each boundary. The virtualizable automated test equipment architecture may also include a single-channel hardware signal source/measurement device. Such as device is an example of the data acquisition and measurement device as illustrated in FIG. 1B as item 180. And, the virtualizable automated test equipment architecture may also include a driver API for configuring and sending/receiving data from the signal source/measurement device. Moreover, the virtualizable automated test equipment architecture may also include a software application capable of calling the driver API, and implementing/checking results against a stored requirement value. That software application may be implemented as processor-executable code stored in a memory and associated with the virtualizable automated test equipment architecture. For instance, the software application may be stored and executed by local controller 160 of FIG. 1A.

In the virtualizable automated test equipment architecture a slice can exist virtually and be redefined. In certain embodiments if the interface of the product is known, it can be used to define the exact location and implementation of each subsequent translation as the signal traverses through the test system. Thus, a signal can flow through the following layers of translation: (1) a cable harness and/or test adapter translating the mass interconnect of the product to the mass interconnect of the system; (2) wiring through terminal blocks or PCBs to convert the mass interconnect of the test system into the individual interconnects of each instance of signal source/measurement hardware; (3) signal source/measurement hardware that translates the interconnect of the hardware to/from digitized data in memory in a host computer; (4) object-oriented hardware abstraction layer that translates the source/measurement data in memory into a virtual hardware resource configurable from multiple software environments; and (5) test executive that translates the virtual hardware resources to/from application file formats (scripts, models, scaling/calibration file, etc.)

Figure 3:
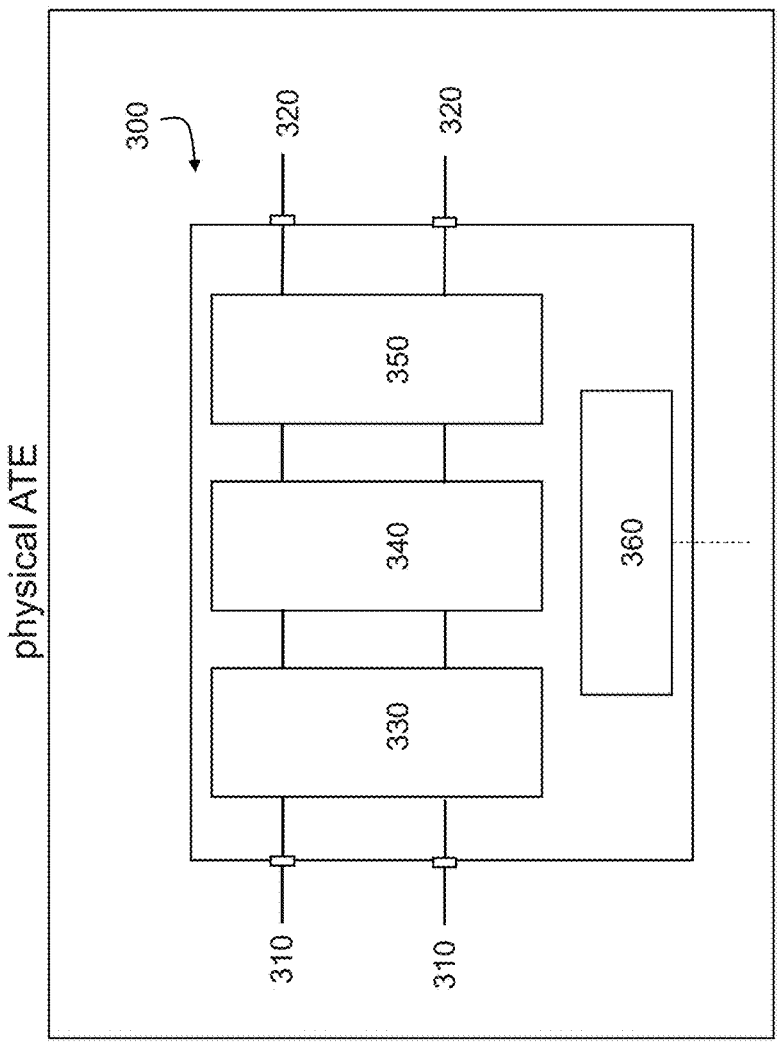
FIG. 3 illustrates an exemplary virtualizable automated test equipment architecture operating in as plurality of virtual automated test equipment architectures according to an exemplary implementation of the principles described herein.
Figure 3:
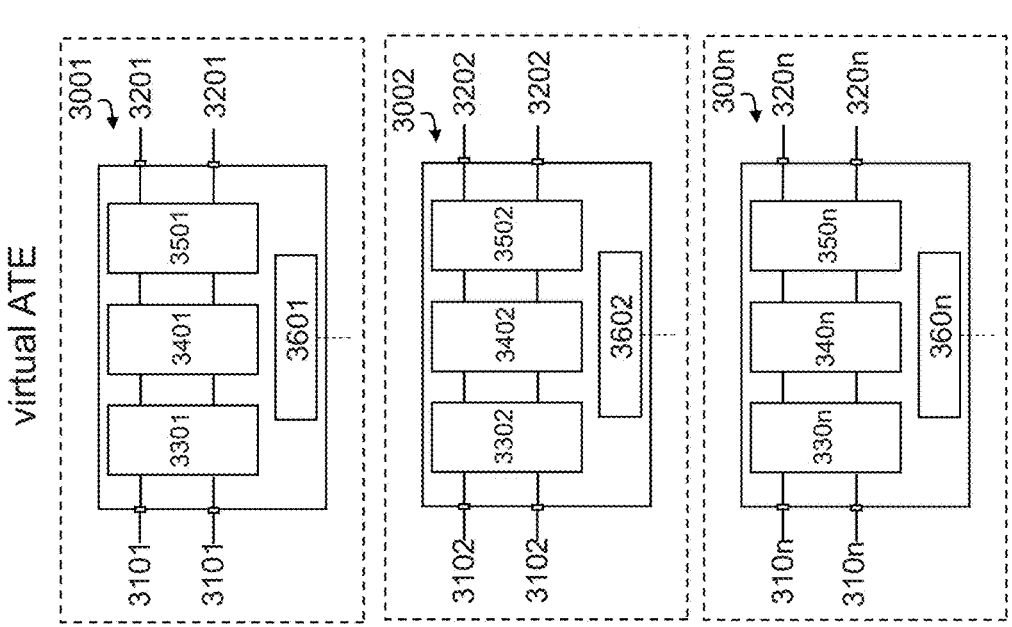

FIG. 3 illustrates an exemplary virtualizable automated test equipment architecture operating in as plurality of virtual automated test equipment architectures according to an exemplary implementation of the principles described herein. As shown in FIG. 3, a virtualizable automated test equipment architecture is defined by a physical automated test equipment (ATE) architecture. The physical automated test equipment architecture includes a circuit assembly 300. The circuit assembly 300 includes multiple inputs 310 and multiple outputs 320. The inputs and outputs can provide for connections to external devices (not shown). The external devices can be units under test (UUTs), loads defined by hardware, or software-based simulation devices that simulate the behavior of electrical components in accordance with the needs of a predetermined test requirements as will be described in further detail herein. The external devices can also include data acquisition and measurement devices as described elsewhere.

As shown in FIG. 3, the circuit assembly 300 can include at least three types of general components including customized components 330, a switching matrix 340, and signal conditioning circuits 350. The customized components 330 can be customizable impedance networks, for example, which are designed to manipulate the signals on signal lines extending between a front plane and a back plane of the circuit assembly 300. The switching matrix 340 may include a plurality of software-configurable physical disconnects, each of which may assume an on state or an off state depending on signals provided by a local controller 360. As illustrated in FIG. 3, the local controller 360 may be disposed in such a manner so as to be part of the overall circuit assembly. In the alternative local controller 360 may be disposed on a board that is coupled to the circuit assembly either directly or indirectly through other components (not illustrated). Regardless of the precise configuration of local controller 360 with respect to circuit assembly 300, the local controller is configured to control various functionality of the automated test equipment architecture including during the use of the automated test equipment architecture.

The physical ATE may be deployed via processor-readable code such as software code or firmware code and the configuration of various software-configurable physical disconnects such that the physical ATE is virtualized and more than one virtual ATE exists on top of the physical ATE. As illustrated conceptually in FIG. 3, the virtual ATEs all appear to the external world, such as one or more UUTs as if each virtual ATE has its own circuit assembly $300_1$, $300_2$, ... $300_n$, their own respective inputs $310_1$, $310_2$, ... $310_n$, and their own respective outputs, $320_1$, $320_2$, ... $320_n$. Each virtual ATE also appears to have its own customized components $330_1$, $330_2$, ... $330_n$, signal conditioning circuits $350_1$, $350_2$, ... $350_n$, and controller $360_1$, $360_2$, ... $360_n$. In this way, multiple UUTs can interface with the physical ATE and can be presented with a virtual ATE environment with a behavior unique to the particular UUT based on the virtual ATE to which it is interfaced. This is achieved by setting the software-configurable physical disconnects to specific states such that the signals present at the various inputs and outputs have properties specified by predetermined test requirements. This is further enabled by the processor-readable code, which is designed to apply a configuration to the physical ATE where the configuration is derived from values input from the predetermined test requirements. This processor-readable code thus makes the virtualizable automated test system self-aware in that it stores values that reflect an expected state of each component within the circuit assembly 300, and can implement a self test to ensure that the various components within circuit assembly 300 have the properties that they are expected to have.

The processor-readable code is designed to accept as an input a plurality of values. The plurality of values may be derived from predetermined test requirements. The predetermined test requirements may be associated with a specific type of UUT. Based on the values input from the predetermined test requirements, the processor-readable code derives a model of the behaviors that the automated test equipment must exhibit in order to satisfy the predetermined test requirements. This can include, for example, calculating relevant signal characteristics (e.g., amplitude, signal-to-noise ratios, frequency, bandwidth), relevant timing requirements, relevant impedance values, among other things. From this model, the processor-readable code is able to rely on the stored model to determine what configuration specific hardware of the physical ATE should be in and determine whether the hardware is in fact in the state that the processor-readable software code has stored based on its model. In one embodiment the processor-readable code is created based on the values input into a computer that is configured to interface with the physical ATE (e.g., computer 170 of FIG. 1A). The processor-readable code can be compiled and installed in memory in the virtualizable automated test equipment architecture. According to certain embodiments the processor-readable software code can be sored on the automated test equipment architecture and may be executed by local controller, which may include, for example, a microprocessor, microcomputer, or specially-designed application specific integrated circuit (ASIC).

In essence, the software stored on the virtualizable automated test equipment architecture can, in combination with the software-configurable physical disconnects, define a hardware abstraction layer (HAL). Therefore, as described earlier an exemplary implementation uses an analog to a software HAL, but for the hardware interconnects. The universal architecture implements something similar to a giant switch matrix which connects any source pin to any mass interconnect pin—analogous to a driver object class in the software HAL—and the matrix is configured with software calls to enable a specific configuration—analogous to an instance of that object class (plugin). Drawing analogies from concepts of object-oriented programming, Options for attributes should consider attributes that fall within natural equilibriums and available hardware ecosystem (read: reality) the following may be defined:

Base unit of computation: grouping of pins numerous enough to accommodate largest signal types and integer multiples of other types;

Elemental standard interfaces: a handful of common connector types using the same pin maps;

Methods: connect product pin to signal source/measurement via various serial and parallel signal conditioning and switching options; and Substitution: easy enough to assemble and disassemble in a relatively small timescale (relative to a custom build) and not requiring extensive extra hardware/features.

Using the above as a guide we can modify the slice model to allow for unit-level requirements (signal flow) to be enumerated while allowing the real-world implementation components—cables, measurement cards, switch components, etc.—to have realistic densities, while minimizing the amount of wasted capacity.

In this modified slice model, a product may need signal types that require 4 wires, 2 wires, 1 wire, and 7 wires all on the same system. A reasonable grouping scheme that can accommodate all of these while falling in typical channel count boundaries for available hardware would be 8 pins. For this signal type requiring 4-wires, there are two signals provided on this group of 8 pins. In the worst case, a user has one extra spare of this signal.

This signal connects to/from a hardware resource with one of these elemental connectors with the correct assignment of pins on groups of 8 pins. If none exists, a standard cable or small PCB can be created to convert that interface to the standard interface. To prevent an unwieldy number of parts options and cables needed for this type of signal, only one card (or a small number such as two) that has the fullest of features for its class will be used.

Since everything is connectorized using cables to go between components, the implementation methods become simple. The number and location of each signal type can be iteratively enumerated to use the fewest resources possible. The first signal of a type required will allocate a mass interconnect to enter the system, a single group of that type, a hardware resource source/measure that signal, and a housing for that resource. The next signal of that type can use the unallocated space on the mass interconnect and if none are available, a new group from available groups on the hardware source/measure resource. This repeats for every signal until an entire system is designed.

The entire system may be built from components that use the same housing, the same format, and are routed on cables with the same connectors/pinouts, so substitution becomes a matter of reconfiguring a handful of components.

With an architecture utilizing the attributes in place, the test system requirements coverage is based on the product requirements. The construction of a test system may be modular to the component level, can permit variability in the format of the test system, with the minimal amount of design or labor. This resulting solution is elegant from a technical perspective.

Exemplary implementations relying on the principles disclosed herein can rely on commonality of signal types and may leverage that commonality. To implement the modeling from the predetermined test requirements, standard libraries of signal implementations may be created in both hardware and software. Each I/O type on a UUT may have an equivalent solution for routing through the test system bulkhead pin to its software simulation endpoint. By specifying a signal type, the requirements covered by the standard implementation can be compared to the requirements of the UUT signal type (i.e. Input Discrete GND/Open). Each implementation may include a description, schematics, specifications, and additional user configuration options. Schematic diagrams show the standard components in the signal path from left to right. For each type of UUT signal supported in a virtualizable automated test equipment architecture according to certain implementations, there are five standard endpoints that can be supported in any combination. The selection of which endpoint is connected to the UUT at any given time is selectable in software. These five modes and their endpoints are listed below.

Simulation Mode—Dedicated UUT Pin connection to software (sim frame) timed I/O. Simulation mode is for any I/O that must concurrently drive signals on the UUT to put it into the appropriate test conditions.

Data Acquisition Mode—Dedicated UUT Pin Connection to hardware-timed monitoring inputs. Data Acquisition (DAQ) mode allows for a second concurrent signal path to be acquired by an independent software environment.

Instrument Mode—Multiplexed UUT Pin Connection to SLSC Bus. Instrument mode is for any measurement or drive signal that is not economical to put on multiple pins concurrently. Typically, these are used as verification paths.

Fault Mode—Dedicated UUT Pin Connection to Bus to SLSC Bus. Fault mode allows a direct connection from a UUT pin to any number of hardware fault states, while protecting the test equipment attached to the pin. Standard fault options are: Open, Short to Bus Pin (typically HIGH, LOW and 2 User Levels) and Short to Adjacent Pin.

Real Source Connect Mode—Dedicated route to real signal source outside of the test system. Real Source Connect mode allows for any pin of the UUT to be connected to another device pin outside of the test system and to switch between the corresponding simulated source.

Once signal paths are defined in a test system of an exemplary virtualizable automated test equipment architecture, verification of the signal paths may be performed. There are several different ways that the signal paths may be verified. One example is the self-test. The self-test can test the operation and connectivity of all signal paths in the system allowing for quick identification of malfunctioning test hardware. Another example is self-cal. Self-cal can include the abilities of self-test, but with the added ability to characterize the full range of all signals at the pin of the mass interconnect and automatically apply scaling constants to the governing software layer.

Since the I/O patterns, routing models, and cabling schemas may be standardized in accordance with disclosed embodiments, it becomes possible to automate the design of a test system instantiation by utilizing a UUT I/O definition. Therefore, in accordance with another inventive aspect lies in a system, method, and computer program product that can automate, in whole or in part, the design of custom test systems. This can permit the creation of custom test systems that can be reused or reconfigured. Such systems, methods, and computer program products can include a pattern library. Given the superset of I/O types that may be identified and implemented in any particular architecture, a library of I/O patterns may be created. This library of I/O patterns may take into account I/O basic types, signal conditioning, and signal modes, combined with cabling and routing options. This library of patterns may then be used as the basis for modelling possible system configurations. Therefore, in producing architectures according to the invention, each system configuration may be a combination of patterns based on a UUT or family or UUTs's I/O needs.

Systems, methods, and computer program products may also include a system model. The system model may be based on a combination of I/O types in a system. This may form the basis for the design of an automated system in accordance with certain exemplary embodiments.

Systems, methods, and computer program products may also include automation scripts. Once a model has been generated from the Pattern libraries many different software scripts may be created and used to generate a variety of system design outputs. These system design outputs may include but are not limited to the following: interconnect maps, cabling instructions, cabling labeling, components lists, bills of material, assembly drawings, assembly instructions, test scripts, software configuration files, and self test scripts.

According to another example of the systems, methods, and computer program products automation may be further enhanced by permitting system design to be automatically generated for a given complement of I/O. When this is done, the design can be used to determine delta configuration for another set of I/O.

Figure 4:
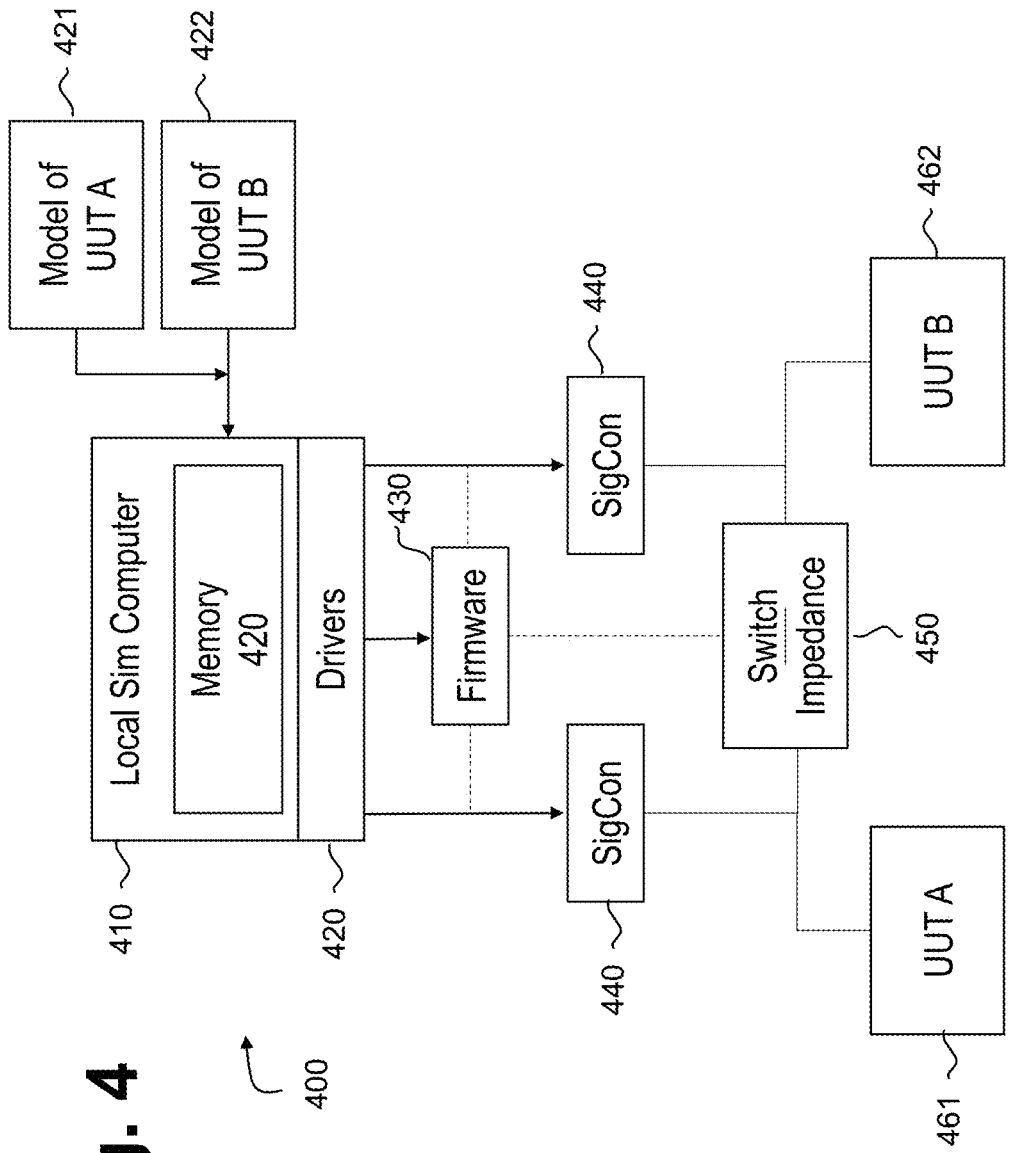
FIG. 4 illustrates an exemplary implementation of how a local controller executing a local simulation computer can interface with firmware and hardware in a virtualizable automated test equipment architecture to conduct various tests of two UUTs.

FIG. 4 illustrates an exemplary implementation of how a local controller executing a local simulation computer can interface with firmware and hardware in a virtualizable automated test equipment architecture to conduct various tests of two UUTs. For example, the virtualizable automated test equipment architecture 400 includes a local controller with the ability to instantiate a local simulation computer 410. The local simulation computer 410 may be instantiated in hardware, software, or a combination of hardware and software. The local simulation computer 410 may interface with a memory 411 having a memory space designed to hold simulation values. The simulation values may be derived from the predetermined test requirements and values gathered from such requirements.

The local sim computer 410 interfaces with firmware 430 through drivers 420. The firmware executes test routines and is able to configure signal conditioning circuits 440, configurable impedances and software-configurable physical disconnects (collectively labeled 450). Two UUTs, namely UUT A 461 and UUT B 462 interface with the switch and impedances. The local sim computer 410 can access memory space 411 which can also be configured to store simulation values for a simulated version of model UUT A 421 and model UUT B 422. This implementation permits the testing of one or both UUT A 461 and UUT B 462 B against models of their idealized states.

Figure 5A:
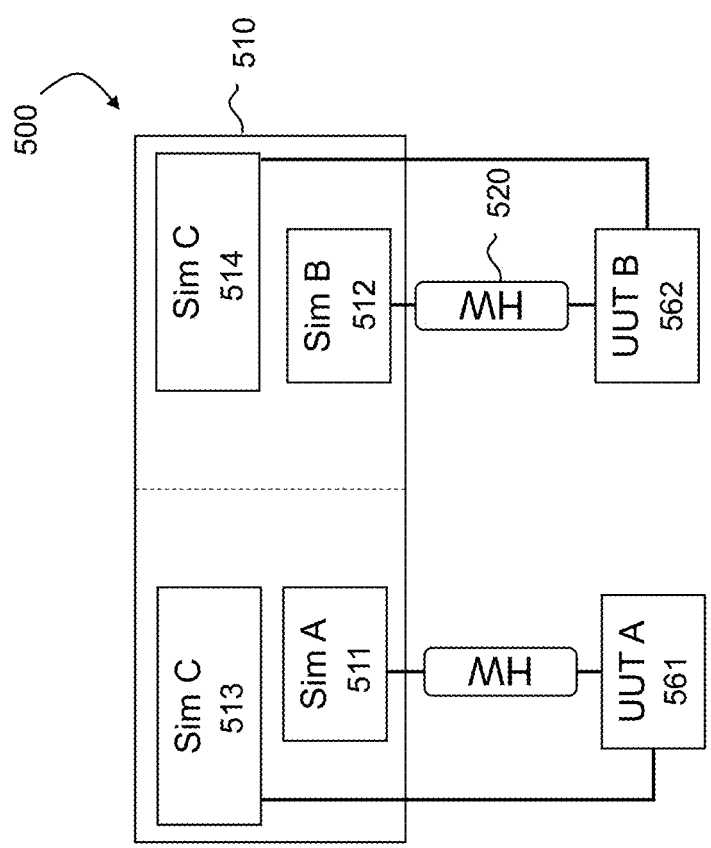
FIGS. 5A-5B are exemplary illustrations of how the virtualizable automated test equipment architecture may be used to perform various tests and simulations according to exemplary implementations of the principles disclosed herein.
Figure 5B:
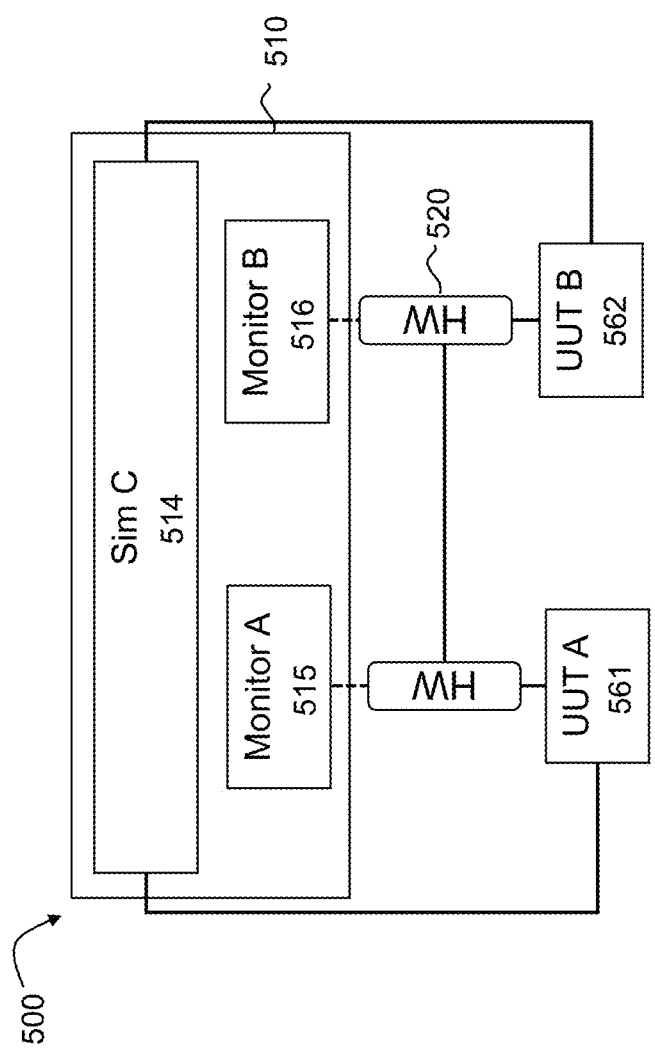

Some implementations of the virtualizable automated test equipment architecture are illustrated in FIGS. 5A-5B. In each of these figures like parts are referred to with like numbers. Similar to the implementation described with respect to FIG. 4, a memory 510 may include stored values associated with a first simulation 511 ("Sim A") and a second simulation 512 ("Sim B"). Another set of simulation values may be provided 513, 514. While each of these simulations are illustrated as being present on memory 510, those skilled in the art will realize that the simulation data may be housed remotely, and provided to the system via a communications link such as a LAN, the Internet, or other communications link. Here, simulation 513, 514 is shown as being divided between two test system instances within a single virtualiziable automated test system 500. In other words, simulation 513, 514 may be used to perform different testing of different units such that each simulation is performed in a manner that appears to be independent of the other simulation, while the hardware architecture may be shared between the two test system instances.

The first and second simulations may be used to evaluate the functionality of a UUT, such as UUT A 561 or UUT B 562. For example, as illustrated in FIG. 5A signals may pass through hardware 520 of the virtualizable automated test equipment architecture. The hardware 520 can include signal conditioning circuit(s) and/or impedance networks. Based on the signals output from memory (or, more precisely, based on signals output from a controller that reads values for Sim A 511 from memory, UUT B 562 can be evaluated against Sim A 511 and Sim C 513. Sim A may provide simulation values and conditions that are unique to the simulation being performed on UUT A 561. Sim C may provide simulation values and conditions that are common to the simulations being performed on UUT A 561 and UUT B 562. To provide simulation conditions (e.g., values or signal conditions), the signals are routed through the hardware of the virtualizable automated test equipment architecture and resultant characteristics are observed.

FIG. 5B illustrates another example of how testing may be realized in an exemplary virtualizable test system architecture according to certain embodiments. For example, two UUTs 561, 562 may be coupled to one another through hardware under certain test conditions provided, for example, from Sim C, 514. In this case, Sim C is not shown as being partitioned between two different virtual automated test equipment architectures and instead is shown as being shared between UUT A 561 and UUT B 562. In this case, two monitors, monitor A 515, and monitor B 516, may be instantiated. These monitors may observe characteristics of the signals exchanged between the two UUTs and the resultant behaviors of the respective UUTs 561 562. The monitored signal properties and behaviors can then be compared against an expected set of behaviors and/or values. They can also be recorded for output or subsequent analysis.

According to an exemplary method of configuring a virtualizable automated test equipment architecture the method includes automatically identifying a plurality of impedance values. This step may be performed automatically based on values input from predetermined test requirements. The method further includes installing the identified impedances of the virtualizable automated test equipment architecture. The method may also include configuring a switching matrix. The switching matrix includes a plurality of software-configurable physical disconnects. The process of configuring the switching matrix may include setting a state of a first subset of the plurality of software-configurable physical disconnects to create a first virtualized automated test equipment architecture based on a first subset of the plurality of test requirements. This first setting process includes setting the state of the first subset of the plurality of software-configurable physical disconnects by opening or closing respective ones of the plurality of a first plurality of signal paths. As explained above, the signal paths of the first plurality of signal paths may be configured to be continuous and isolated from other signal paths of the first plurality of signal paths between an input and an output of the virtualizable automated test equipment architecture.

The state of a second subset of the plurality of software-configurable physical disconnects can be used to create a second virtualized automated test equipment architecture based on a second subset of the plurality of test requirements. The setting of the state of the second subset of the plurality of software-configurable physical disconnects opens or closes a second plurality of signal paths. Consistent with the description above, the signal paths of the second plurality of signal paths can be continuous and isolated from other signal paths of the second plurality of signal paths between an input and an output of the virtualizable automated test equipment architecture.

The configuration of the virtualizable automated test equipment architecture, and more specifically, the switching matrix of the virtualizable automated test equipment architecture includes receiving generated control signals. The control signals may be based on a received plurality of test requirements. And, the state of the first and second subset of the plurality of software-configurable physical disconnects may be set based on the control signals.

The method may also include performing a system self-check routine. The system-self check routine may be performed by comparing the state of the first subset of software-configurable physical disconnects to an expected state of the first subset of software-configurable physical disconnects. The expected state of said first subset of software-configurable physical disconnects may be determined based on the first subset of the plurality of test requirements.

In each of these exemplary methods, the first subset of the plurality of test requirements may or may not be distinct from the second subset of the plurality of test requirements. According to another example, the plurality of test requirements is associated with a first unit under test and the second subset of the plurality of test requirements is associated with a second unit under test, the first and second units under test having different operational requirements.

Figure 6:
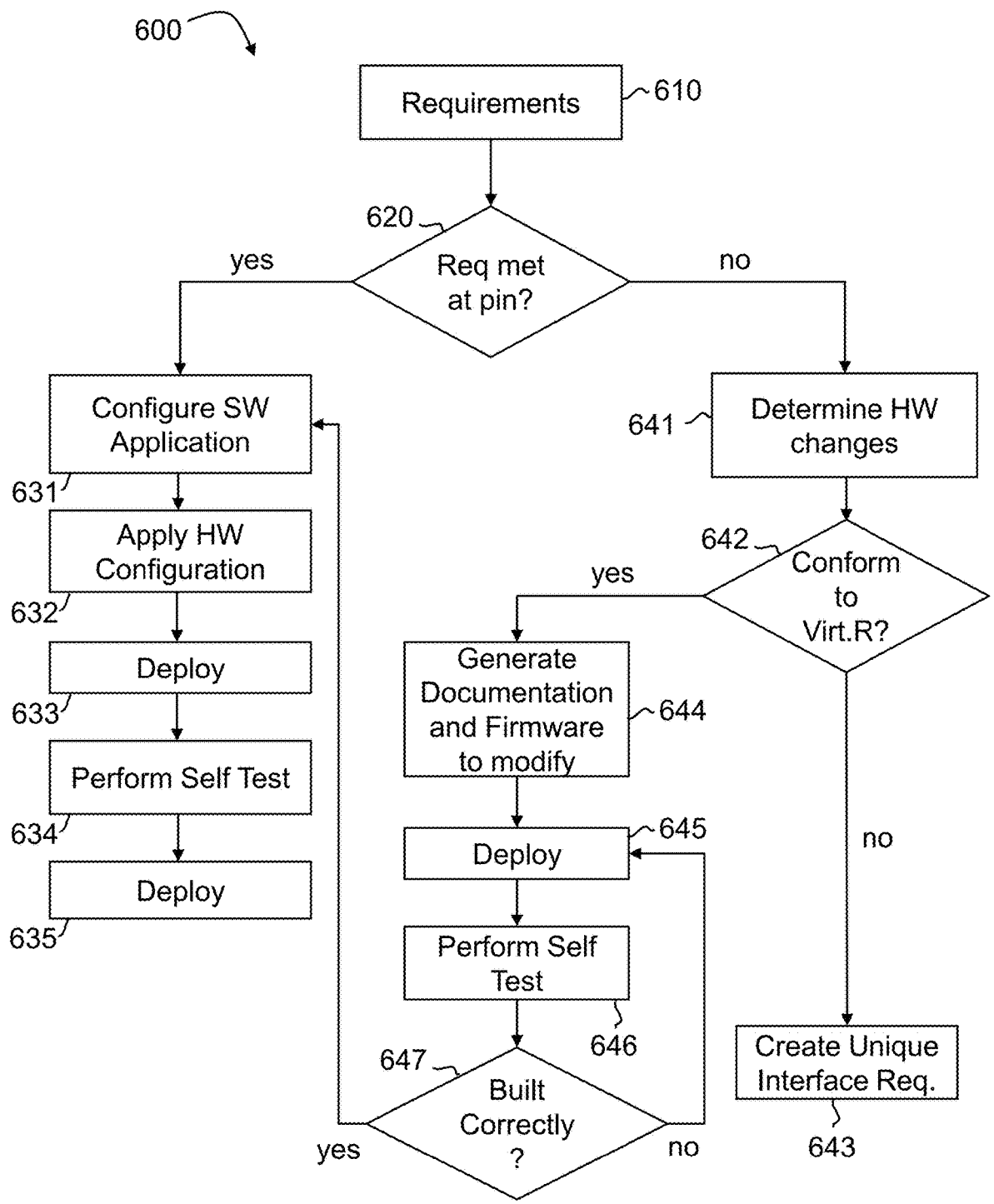
FIG. 6 shows a flowchart illustrating an exemplary embodiment of the software used for designing and implementing a virtualizable automated test equipment architecture according to exemplary embodiments consistent with the principles disclosed herein.

FIG. 6 shows a flowchart illustrating an exemplary embodiment of the software used for designing and implementing a virtualizable automated test equipment architecture according to exemplary embodiments consistent with the principles disclosed herein. Automated test system requirements are received. These requirements may be received, for example, from a customer or other entity requesting the design of an automated test system. Such requirements specify various requirements that must be met at certain pin locations to test the operation of one or more units under test (UUTs). These requirements are ingested 610 into the inventive computer system and associated software for the automated design of a virtualizable automated test equipment architecture. The requirements can include parameters and information associated with the pin location.

After the requirements are ingested, the software evaluates the requirements against a library of potential configurations and conditions that may be met based on the hardware architecture. These libraries may be adaptive, and additional learning and system design may allow the libraries to be expanded to permit the recognition of additional patterns of requirements based on additional unique designs that are created based on manual systems engineering for instances in which the libraries fail to file an acceptable configuration for a set of requirements. Thus, the software is configured to make an evaluation 620 against the libraries as to whether a specific requirement can be met at a specific pin based on the ingested requirements 610. If the requirements can be met at the pin, the software application can be configured 631. This configuration of software can include defining firmware and/or software routines that rely upon the specific configuration of the hardware and requirements to simulate and test certain functionality and behaviors of the UUT based on the testing requirements. The virtualizable automated test equipment architecture can be configured 632, such as, for example, by setting the software configurable physical disconnects and installing impedances as specified by the identified solution for the requirements identified by the software. After the hardware and software have been configured, the virtualizable automated test equipment is deployed 633. The deployment of the virtualizable automated test equipment architecture permits the system to execute a self-test routine 634. The self-test routine may be configured as part of the software application configuration 631, and is designed to ensure that the virtualizable automated test equipment architecture is implemented consistent with the hardware and software configurations defined in the library identified by the software based on prior solutions. If the self-test 634 is successful, then the virtualizable automated test equipment architecture is deployed and a UUT may be connected to the architecture to permit testing of the UUT.

If no predefined solution for a particular requirement is found for a particular pin or parameter 620, then the software is configured to identify the specific pin and parameters that cannot be met with pre-existing designs. The software will then evaluate potential solutions from a defined set of impedances, switch states, and signal conditions 641. These potential solutions will be compared to a set of virtualization rules to ensure that the solution conforms to the virtualization rules 642. Virtualization rules ensure that the proposed solution can be implemented within the virtualizable automated test equipment architecture without adversely impacting the virtualizable aspects of the design and ensuring that the resulting architecture can maintain virtualization within the system. If a determination is made that a solution cannot conform to virtualization rules 642, a unique set of interface requirements may need to be devised and custom-engineering may need to be performed. The result of such custom-design may be fed back into the software and stored as an exemplary solution within the library of solutions that may be implemented for future virtualizable automated test equipment architecture designs.

If it is determined that the solution conforms to virtualization rules 642, the documentation for the system design and the firmware for the design may be generated 644. In certain embodiments, firmware may be implemented as any computer-readable software instructions and it is not a requirement of the invention that the software code be implemented in firmware. Once the design has been verified to conform to virtualization rules 642, the firmware and documentation is generated 644, the system may be deployed 645 with the appropriate impedances and software configurable physical disconnects being set to the appropriate state. A self-test routine 645 can then be performed on the deployed architecture to ensure that it is consistent with the solution defined by the hardware changes 641 and determined to meet the virtualization rules 642. If the design is not deployed correctly, 647, the deployment will be reconfigured and redeployed as indicated by the feedback loop. If the design is deployed correctly 647, the designed solution will be designed into the virtualizable automated test equipment architecture along with the other hardware that has been identified to meet the provided requirements 610, and the process may then proceed through steps 631 to 635 as illustrated.

Although specific embodiments and advantages have been described above, various embodiments may be envisioned based on the teachings of the present disclosure. Various embodiments of the disclosed inventions are to be understood to have various advantages over prior art system architectures and design methods. It is to be understood that these advantages are not intended to be exhaustive and are intended to be merely exemplary advantages over prior technologies.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The invention claimed is:

1. An apparatus comprising:
a first slice defined within a virtualizable automated test equipment architecture, the first slice comprising:
a first plurality of signal paths;
a first impedance disposed along at least one signal path of the plurality of signal paths;
a first plurality of configurable disconnects, the first plurality of configurable disconnects being configured to open or close at least one of the first plurality of signal paths;
a second slice defined within the virtualizable automated test equipment architecture, the second slice comprising:
a second plurality of signal paths;
a second impedance disposed along at least one signal path of the second plurality of signal paths;
a second plurality of configurable disconnects, the second plurality of configurable disconnects being configured to open or close at least one signal path of the second plurality of signal paths;
a controller configured to be coupled to the first plurality of configurable disconnects and second plurality of configurable disconnects, wherein the controller is configured to control a state of the first and second plurality of configurable disconnects such that at least one of the slices is configured to operate in one of a simulation mode, a data acquisition mode, an instrument mode, a fault mode, or a real source connect mode.

2. The apparatus of claim 1, wherein the first slice and the second slice are configured to operate in different modes.

3. The apparatus of claim 1, wherein the first slice and the second slice are configured to operate in the same modes.

4. The apparatus of claim 1 wherein the controller is configured to control the state of the first configurable disconnects to reconfigure the first slice so that the first slice is selectively operable in any one of a simulation mode, a data acquisition mode, an instrument mode, a fault mode, or a real source connect mode.

5. The apparatus of claim 1 further comprising an external device connection configured to interface with a unit under test.

6. The apparatus of claim 1 further comprising a first external device connection corresponding to the first slice and a second external device connection corresponding to the second slice wherein each of the first external device connection and the second external device connection are configured to interface with a unit under test.

7. The apparatus of claim 1 further comprising a signal conditioner disposed along a signal path of the first plurality of signal paths, said signal conditioner being configured based on predetermined test requirements.

8. A method comprising:
configuring a first slice defined within a virtualizable automated test equipment architecture, the first slice comprising:
a first plurality of signal paths;
a first impedance disposed along at least one signal path of the first plurality of signal paths;
a first plurality of configurable disconnects, the first plurality of configurable disconnects being configured to open or close at least one of the first plurality of signal paths;
configuring a second slice defined within the virtualizable automated test equipment architecture, the second slice comprising:
a second plurality of signal paths;
a second impedance disposed along at least one signal path of the second plurality of signal paths;
a second plurality of configurable disconnects, the second plurality of configurable disconnects being configured to open or close at least one signal path of the second plurality of signal paths;
wherein the first slice is configured at least in part by setting the state of the first plurality of configurable disconnects such that the first slice is configured to operate in one of a simulation mode, a data acquisition mode, an instrument mode, a fault mode, or a real source connect mode and wherein the second slice is configured at least in part by setting the state of the second plurality of configurable disconnects such that the second slice is configured to operate in one of a simulation mode, a data acquisition mode, an instrument mode, a fault mode, or a real source connect mode.

9. The method of claim 8 wherein the configuration of the slice is performed based on predetermined test requirements.

10. The method of claim 8, further comprising:
configuring the first slice to operate in a first mode; and
configuring the second slice to operate in a second mode, wherein the second mode is different than the first mode.

11. The method of claim 8 wherein the step of configuring the first slice is performed at runtime.

12. The method of claim 8 further comprising interfacing at least one of the first slice and the second slice with a unit under test.

13. A non-transitory computer readable storage medium having processor-executable code stored thereon, the processor-executable code configured to:
receive first input data associated with first predetermined test requirements associated with a first unit under test;
virtualize a first slice of an automated test equipment architecture based on the received first input data, wherein virtualizing the first slice includes controlling a state of a first plurality of configurable disconnects such that the first slice is configured to operate in a first one of a plurality of predetermined modes; and
virtualize a second slice of the automated test equipment architecture, wherein virtualizing the second slice includes controlling a state of a second plurality of configurable disconnects such that the second slice is configured to operate in a second one of the plurality of predetermined modes.

14. The non-transitory computer readable storage medium of claim 13 wherein the processor-executable code is further configured to virtualize the second slice of the automated test equipment architecture based on the received input data associated with the unit under test.

15. The non-transitory computer readable storage medium of claim 13 wherein the processor-executable code is further configured to receive second input data associated with second predetermined test requirements associated with a second device under test, wherein virtualizing the second slice of the automated test equipment architecture is performed based on the received second input data.

16. The non-transitory computer readable storage medium of claim 13 wherein the processor-executable code includes code to define slice configurations associated with the plurality of predetermined modes.

17. The non-transitory computer readable storage medium of claim 16 wherein the plurality of predetermined modes include: a simulation mode, a data acquisition mode, an instrument mode, a fault mode, or a real source connect mode.

18. The non-transitory computer readable storage medium of claim 13 wherein the processor-executable code is further configured to cause a controller to execute a self-test routine, said self-test routine determining whether at least one of the first and second slice is virtualized properly in accordance with a model determined based on the first predetermined test requirements.

\* \* \* \* \*